(12) United States Patent
To et al.

(10) Patent No.: US 6,747,483 B2
(45) Date of Patent: Jun. 8, 2004

(54) DIFFERENTIAL MEMORY INTERFACE SYSTEM

(75) Inventors: Hing Y To, Folsom, CA (US); James A McCall, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 94 days.

(21) Appl. No.: 10/136,920

(22) Filed: May 1, 2002

(65) Prior Publication Data

US 2003/0206046 A1 Nov. 6, 2003

(51) Int. Cl.[7] .......................................... H03K 19/0175
(52) U.S. Cl. ............................... 326/86; 326/80; 326/83
(58) Field of Search ........................ 326/80–83, 86–87, 326/63; 327/108, 109, 333

(56) References Cited

U.S. PATENT DOCUMENTS

| | | | | |
|---|---|---|---|---|
| 5,977,796 A | * | 11/1999 | Babara | .......................... 326/86 |
| 6,262,598 B1 | * | 7/2001 | Cairns et al. | .................. 326/81 |
| 6,323,698 B1 | * | 11/2001 | Fletch | .......................... 327/100 |

* cited by examiner

Primary Examiner—Anh Q. Tran
(74) Attorney, Agent, or Firm—Pillsbury Winthrop LLP

(57) ABSTRACT

A memory interface system comprising a differential control interface coupled with a first power supply, a common voltage supply and a buffer unit. The control interface is configured to drive a first and a second differential control output signal wherein the voltage output swing of the first and second differential control output signals is between a voltage output high level and the common voltage. The system also comprising a plurality of single-ended memory interfaces coupled with a second power supply, the common voltage supply and the buffer unit, wherein each memory interface is configured to drive a single-ended memory output signal to the common voltage to transfer a logic low, and the system also comprising the buffer unit coupled with the first power supply, the buffer unit configured to transfer data between the control interface and the memory interface.

21 Claims, 11 Drawing Sheets

DIFFERENTIAL MEMORY INTERFACE SYSTEM

TECHNICAL FIELD

An embodiment of the invention relates to communication between semiconductor devices and more particularly, to systems for transferring data over a differential memory interface.

BACKGROUND INFORMATION

Applications that require memory must interface with the memory in order to store and retrieve data. For instance, in Personal Computers (PCs) and workstations, a control unit located in a memory control hub (MCH) communicates with a memory unit by sending and receiving data signals over a bus. If large amounts of memory are required, one or more memory units are placed on a memory module such as a Single In-line Memory Module (SIMM) or a Dual In-line Memory Module (DIMM). The MCH can be placed on the module as well, if not then the modules are connected to an external bus in order to communicate with the MCH.

A multi-drop bus is a typical bus configuration used for interfacing between a memory module and the MCH. In a multi-drop bus architecture, a master device, such as an MCH, communicates over a bus by addressing one or more slave devices, such as a memory unit or memory module. Typically, a multi-drop bus will have one communication port for each coupled memory unit or module. The communication port will generally include address, data, command and side-band pins for communication between the MCH and the memory units or modules. However, the numerous connections on the multi-drop bus create signal reflections within the bus, so effort is required to minimize the reflections, since reflections can impede proper data transfer over the bus.

There are many types of memory units available. One of the more common types of memory unit is a Dynamic Random Access Memory (DRAM) unit, of which there are also many varieties. It is generally a goal to increase the amount of memory in a PC or workstation without increasing the amount of space taken up by the memory. As a result, DRAM units are typically pin-limited or, in other words, the DRAM packaging constraints and size constraints of the environment only allow for external connections to a certain number of DRAM signal pins. Due to the pin limitations, the DRAM units can generally only support a single-ended interface, as opposed to a differential interface. This is because the single-ended interface only requires one external pin connection to transfer a data signal.

Another concern in memory interfaces is power consumption, which grows as the amount of memory in the interface system increases. When devices consume power, they generate heat and as the power consumption grows, more hardware is needed to dissipate the heat. This becomes especially difficult as operating frequencies rise.

BRIEF DESCRIPTION OF THE DRAWINGS

The methods and apparatuses described herein will be described with reference to the accompanying drawings, wherein.

The components in the figures are not necessarily to scale, emphasis instead being placed upon illustrating the principles of the invention. In the figures, like reference numerals designate corresponding parts throughout the different views.

DETAILED DESCRIPTION

The systems and methods for a differential interface described herein provide for optimal and efficient data transfer between a control unit and multiple memory units. The control unit and each memory unit contain an interface, which drives and receives the data being transferred over the bus. A buffer unit is connected between the control interface and the memory units to multiplex the data from the control unit to the correct memory unit and back. The memory interface system described herein allows the control interface and memory interfaces to operate with reference to a common low power supply without compromising the performance of either interface.

Figure 1:
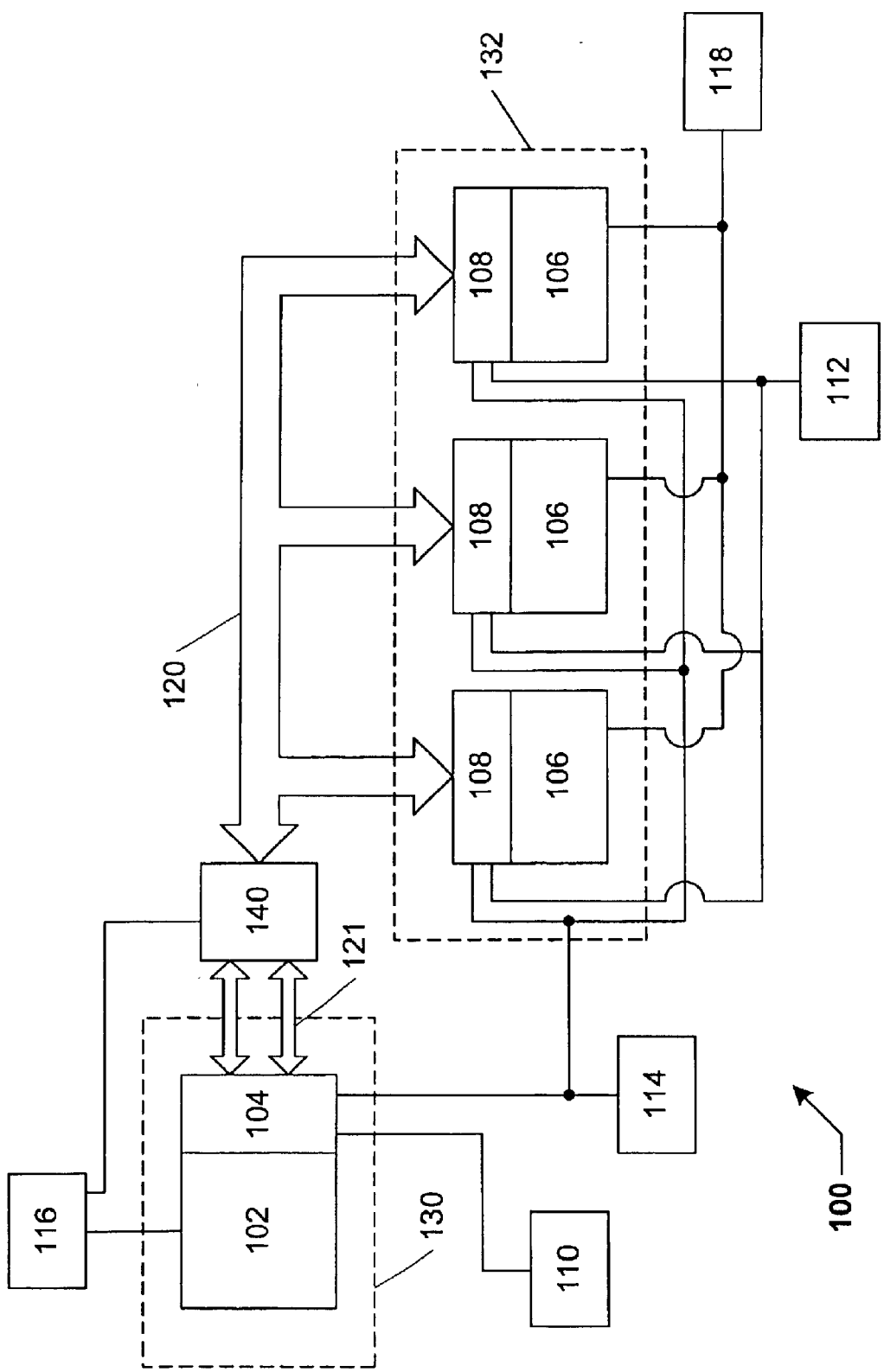
FIG. 1 is a schematic view of one embodiment of a memory interface system according to the present invention.

FIG. 1 depicts memory interface system 100 in accordance with the systems and methods described herein. Memory interface system 100 includes control unit 102 located in MCH 130, buffer unit 140 and memory units 106 which are located in memory module 132. MCH 130 includes control interface 104, which is supplied by control interface power supply 110. Each memory unit 106 couples to a memory interface 108 which is supplied by memory interface power supply 112. Control interface 104 and memory interfaces 108 communicate through buffer unit 140. Additionally, control unit. 102 and buffer unit 140 are supplied by control unit power supply 116 and memory units 106 are supplied by memory unit power supply 118.

Control interface 104 transfers data to a selected memory interface 108 by outputting the pair of differential control output signals to buffer unit 140 over differential bus 121. Buffer unit 140 then converts the differential control output signals to a single-ended control output signal and multiplexes that signal to the selected memory interface 108. Memory interface 108 transfers data to control interface 104 by outputting the single-ended memory output signal to buffer unit 140 over bus 120, which is preferably a multi-drop bus. Buffer unit 140 then converts the single-ended memory output signal to a pair of differential memory output signals and outputs those signals to the control interface 104. Control interface 104, memory interfaces 108 and buffer unit 140 are connected to common supply 114.

A typical interface transfers data by outputting a digital output signal onto a bus. There are typically two types of interfaces: single-ended and differential. A single-ended interface uses one output signal to transfer data. The output signal can be either a logic high or a logic low. These logic levels are generally pre-determined voltage levels, where a logic high is output at a voltage output high level ($V_{OH}$) and a logic low is output at another, lower, voltage output low level ($V_{OL}$). The difference between $V_{OH}$ and $V_{OL}$ is referred to as the voltage output swing.

A differential interface uses two signals to transfer data. Similar to the single-ended interface, each differential output signal is driven to a pre-determined voltage level, either a voltage output high level ($V_{OH}$) or a voltage output low level ($V_{OL}$). However, it is the difference in voltage between the two signals which translates to a specific logic level, not the voltage level of any one signal at a point in time. The differential interface is advantageous in that it can operate at higher frequencies because two signals are used to transfer one piece of data and this results in a higher overall signal integrity.

In typical memory systems, the interfaces operate at different voltage output levels, each referenced to a high power supply, and the buffer unit scales the voltage output levels to be consistent with that of the receiving interface. However, the buffer circuit is connected to both interface power supplies to properly scale the signals. This makes packaging the buffer circuit difficult because access to multiple power supplies is required. Typically, the buffer circuit is packaged in a ball-grid array (BGA) and adding another power supply requires the addition of another power plane. As the number of power planes in a BGA increases, so does the cost. The BGA also becomes more susceptible to defects within the printed circuit board.

Therefore, this method of eliminating the need for the shared interface power supply adds additional voltage scaling circuitry and cost overhead to the entire memory system interface. Also, since the voltage output levels are generally referenced to a high power supply and drive current at both the logic high and logic low levels, the system dissipates a significant amount of power and heat. In addition, redesigning the system to adapt to smaller or more optimal semiconductor processes is more difficult due to the voltage scaling circuitry.

One typical method to eliminate the voltage scaling requirement is to force the control interface and memory interface to operate using the same interface power supply and reference the voltage output levels to that power supply. This however compromises the performance of both interfaces. Memory units 106 generally need to operate at a different voltage, usually higher than control unit 102 because of the characteristics of the memory process technologies that are used. Memory process technologies usually have thicker device (P-type & N-type) gate oxide. This keeps the manufacturing costs lower for memory products. With the thicker device gate oxide, the speed of operation in memory unit 106 is limited. In order to make up for this speed deficiency, particularly when memory units 106 are interfacing with control unit 102 memory units 106 generally need to operate at a higher voltage. Therefore, if the level of memory interface power supply 112 is chosen to optimize control unit 102 performance then memory unit 106 must be designed to interface at a lower voltage. This in turn slows down memory interface 108 in memory unit 106.

Control unit 102 is usually implemented with a microprocessor type of process technology. The microprocessor type of process technology uses thinner device gate oxide to boost up the operating need. However, devices with thinner gate oxide cannot withstand higher voltage supplies, like the one required by memory unit 106. Therefore a higher memory interface power supply 112 level chosen to optimize memory unit 106 performance will sacrifice the reliability of memory system interface 100.

Some typical memory systems have attempted to minimize this inefficiency by creating special devices (P-type & N-type) with thicker oxides in the microprocessor process technology. However, this adds cost to the process technology. Furthermore, it hinders the advancement of the process in terms of its optimum operation speed that the process can provide.

Memory interface system 100 allows control interface 104 and memory interfaces 108 to operate using isolated interface power supplies 110 and 112, respectively, without the need for buffer circuit scaling circuitry. This advantage allows each interface 104 and 108 to operate at a voltage supply level specifically optimized for the performance requirements of that interface without compromising performance. Memory system interface 100 also uses a differential interface for control interface 104. This allows control interface 104 to operate at higher frequencies than a single-ended interface.

In addition, because buffer unit 140 is coupled only to control unit power supply 116 and not to memory unit power supply 118 as well, buffer unit 140 can operate at the lower voltage of control unit power supply 116. This is important because the semiconductor fabrication process of control unit 102 and memory unit 106 are not always the same, and typically the process used to fabricate control unit 102 cannot handle the electrical stress created by the higher memory unit power supply 118. Since buffer unit 140 is coupled only to control unit power supply 116, it can avoid the electrical stress created by coupling to the higher voltage memory unit power supply 118.

Memory interface system 100 uses voltage output levels referenced to shared common supply 114, which is preferably ground. $V_{OL}$ is preferably set at or near this common supply 114, while $V_{OH}$ is set at a higher level. $V_{OH}$ is preferably set less than either interface power supplies 110 or 112, and provides a voltage output swing large enough to overcome noise levels, while at the same time small enough to enable proper operation at the desired frequencies. The specific voltage output levels chosen are dependent on each application and environment. Since interface power supplies 110 and 112 are set to levels that optimize interface performance, and are preferably levels that are higher than the voltage output levels, both control and memory interface 104 and 108 can satisfy the voltage output swing without compromising performance.

In one embodiment for example, control unit power supply 116 and control interface power supply 110 both operate at 2 volts (v), while memory unit power supply 118 and memory interface power supply 112 both operate at 3.3 v. Both control interface 104 and memory interface 108 are coupled with common supply 114, in this case ground. $V_{OL}$ is preferably set at or near the common supply 114 voltage level, which is ground, or 0 v, while $V_{OH}$ is preferably set at 0.8 v. Therefore in the single-ended memory interface between buffer unit 140 and memory interfaces 108, a logic high single-ended memory output signal transferred over bus 120 would be output at 0.8 v, while a logic low would be output at 0 v.

In the differential control interface between buffer unit 140 and control interface 104, differential control output signals transferred over bus 120 would be output at either 0.8 V or 0 v. The difference between the two translates into either a logic high or a logic low, depending on the application. In one embodiment of memory system 100, a first differential control output signal at 0.8 v and a second differential control output signal at 0 v could translate into a logic high. Conversely, when the first differential control output signal at 0 v and the second differential control output signal at 0.8 v could translate into a logic low. These voltage output swings of 0.8 v are well within the interface power supply range of both the control unit and the memory unit. Therefore, this configuration allows each interface to operate at an optimized interface power supply level.

Control interface 104 and memory interface 108 each preferably include input/output (IO) pins used for data transfer. Each IO pin includes a driver for outputting signals and a receiver for receiving output signals output by a separate interface. The driver provides enough current to drive the output signal to a receiver at the receiving interface. The drivers and receivers coupled to buses 120 and 121, as well as buses 120 and 121 themselves all create loads and noise which hinder the ability to transfer data. Noise and loading degrades the signal integrity of the output signal and makes it difficult for the receiver to successfully interpret the logic levels. Thus, the driver must provide enough current to overcome the loading and noise degradation and maintain the signal integrity at a level sufficient for the receiver to interpret the data.

Figure 2:
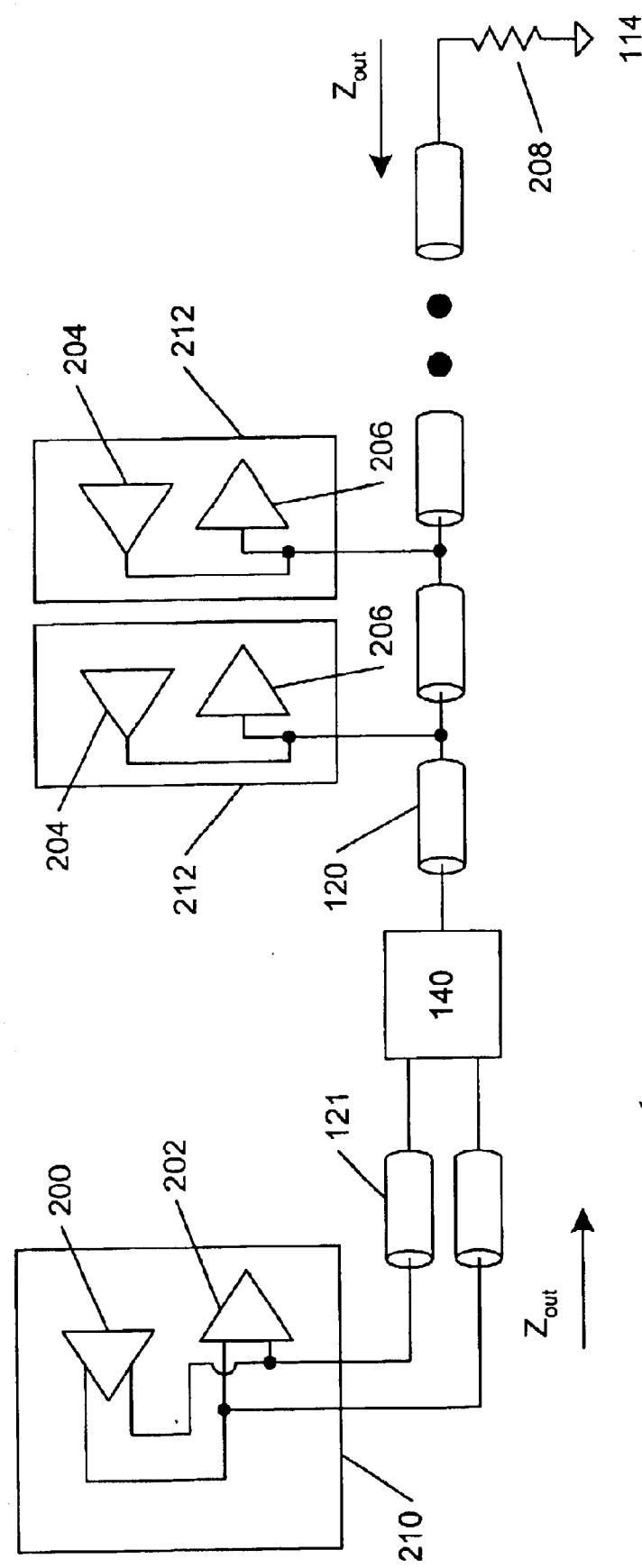
FIG. 2 is a schematic view of the memory interface system of FIG. 1 depicting driver and receiver arrangement.

FIG. 2 depicts memory interface system 100 in accordance with the systems and methods described herein. Shown here is control interface IO pin 210 coupled to bus 121. Control interface IO pin 210 includes control driver 200 and control receiver 202. Bus 121 is further connected to buffer unit 140 which in turn is connected to memory interface IO pins 212 by way of bus 120. Each memory interface IO pin 212 includes memory driver 204 and memory receiver 206. Bus 120 is terminated with termination resistor 208 which minimizes the signal reflections on bus 120.

In this embodiment, bus 120 is a 64-bit (b) single-ended bus. Each memory interface 108 includes an 8b bus connected to bus 120 for communication with control unit 102. This embodiment allows up to eight memory units 106 to be included on memory module 132. Bus 121 is a 128b differential bus. Accordingly, control interface 104 includes a 128b bus for communication with the eight memory units 106, through buffer unit 140.

Figure 3:
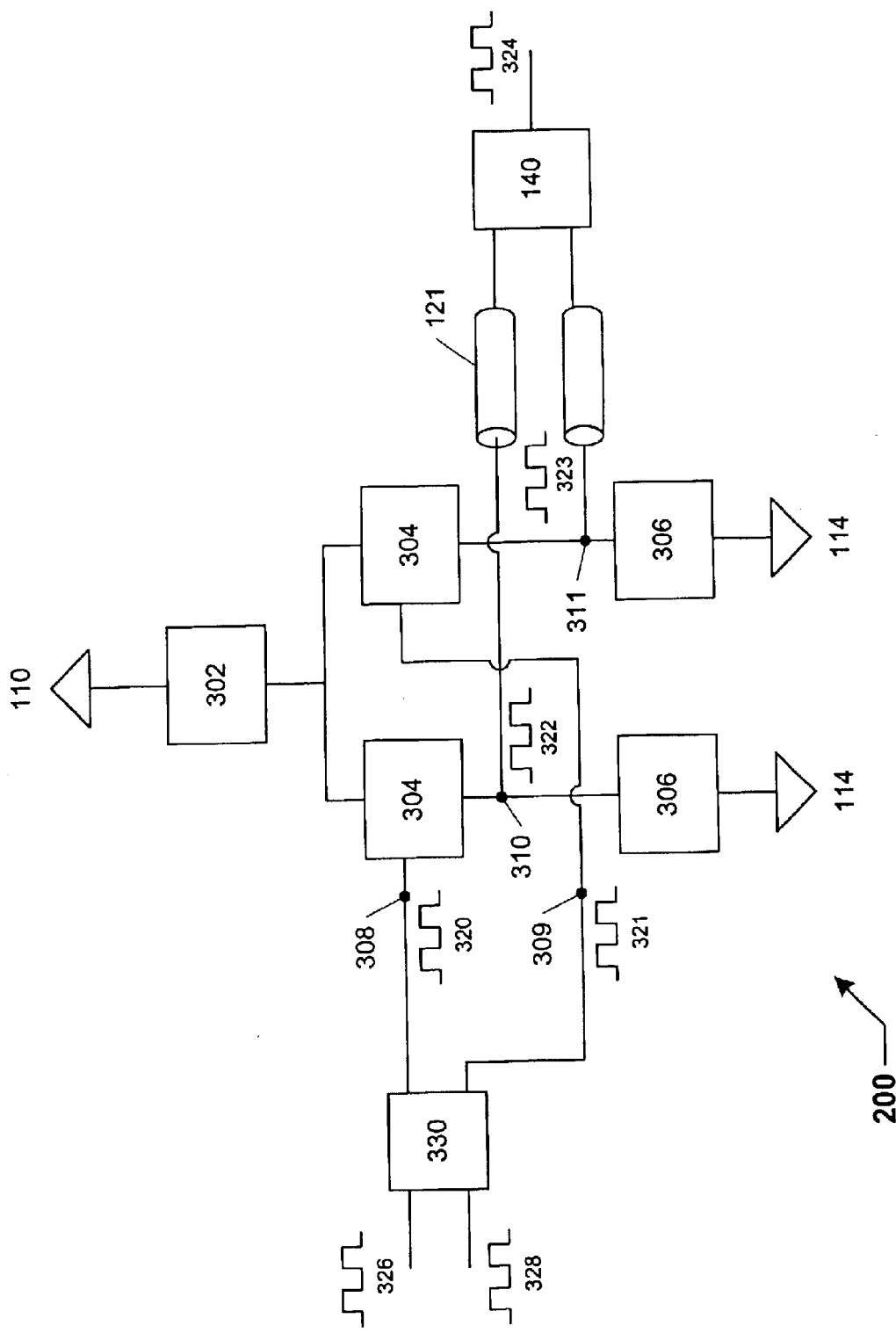
FIG. 3 is a schematic view of one embodiment of the control driver of FIG. 2.

FIG. 3 depicts control driver 200 in accordance with the systems and methods described herein. Control driver 200 preferably includes current source 302, two switching units 304 and two resistive bias units 306. Current source 302 is connected to control interface power supply 110 and switching unit 304. Resistive bias units 306 are connected to common supply 114. Pre-driver circuit 330 takes internal control input signals 326 and 328 and converts them to differential control output signals 320 and 321 with controlled data edge rates. Internal control input signals 326 and 328 are internal logic signals generated by control unit 102. Pre-driver circuit 330 then provides differential control output signals 320 and 321 to switching units 304 at inputs 308 and 309, respectively. First and second differential control output signals 322 and 323, are output from control driver 200 at outputs 310 and 311 respectively, which are coupled to bus 121.

By using current source 302, as opposed to a voltage source, control driver 200 creates a high internal resistance at outputs 310 and 311. This high internal resistance is less susceptible to noise and allows control driver 200 to operate at higher frequencies than a driver implementing a voltage source. Depending on the application, this internal resistance, sometimes referred to as the on resistance, can be on the order of 20 times larger than a driver using a voltage source.

Pre-driver circuit 330 controls the data edge rate of differential input data signals 320 and 321 and preferably provides faster voltage swings which translate into more abrupt logic transitions. Pre-driver circuit 330 is preferably included within control driver 200, but can be left out of the driver design if the application does not require additional data edge rate control, in which case internal control input signals 326 and 328 would replace first and second differential control input signals 320 and 321 as the inputs to switching units 304.

Switching units 304 are configured to open and close according to differential control input signals 320 and 321. When a switching unit 304 is open, current source 302 cannot provide control output current to the output connected to that switching unit. That output is driven to common supply 114 and the respective differential control output signal is output to bus 121 at the $V_{OL}$ level. When a switching unit 304 is closed, current source 302 drives control output current through the resistive bias unit 306. Resistive bias units 306 are resistive loads that create a voltage drop when control output current is passed through it. The voltage at control interface power supply 110 less the voltage drop over resistive bias unit 306 and the voltage at common supply 114, is the $V_{OH}$ level driven onto bus 121. Accordingly, resistive bias unit 306 is sized such that the desired $V_{OH}$ level is met. Differential control output signals 322 and 323 are transferred over bus 121 to buffer unit 140, which then converts the two signals to single-ended control output signal 324.

In a preferred embodiment, common supply 114 is set to ground. This configuration provides the advantage of driving control output current only when output 310 or 311 is at $V_{OH}$. When a switching unit 304 is open, no control output current is passing through that switching unit and control driver 200 dissipates little power at the respective output 310 or 311. Control driver 200 only dissipates a significant amount of power when a switching unit 304 is closed and current is passing through it. The typical configuration where current is driven despite the state of switching unit 304 will generally result in twice the power dissipation.

In this embodiment, common supply 114 is set to ground, so $V_{OL}$ is equal to 0 v. Therefore, $V_{OH}$ is equal to the output voltage swing ($V_{out}$) for memory interface system 100. $V_{out}$ is equal to the output current ($I_{out}$) times the effective resistance in the channel (which is equal to the resistance (RR) of the two resistive bias units 306 in parallel or:

$$V_{out} = I_{out} \cdot R_{out} = I_{out} \cdot (R_B \| R_B).$$

Resistive bias units 306 have a set resistance so that the parallel combination of the two will create a resistance at or near the output impedance ($Z_{out}$) of bus 121, which is measured at the termination of bus 121 as shown in FIG. 2. This is in order to minimize signal reflections created by the termination of bus 121. In this embodiment, $Z_{out}$ and $R_{out}$ are both 65 Ω.

The power budget available to control interface 104 determines the $I_{out}$ provided by current source 302. The power budget is the amount of power available over time, and is determined by the application and typically depends on the available power supplies, heat dissipating equipment and maximum reliable operating temperatures. In this embodiment, control unit 102 has 128 separate IO pins 210, each connected to 128b bus 121. The power budget should be greater than or equal to control interface power supply 110 times $I_{out}$ times the number of IO pins, or:

Power Budget $\geq I_{out} \cdot$ Power Supply 110 $\cdot$ number IO pins

In this embodiment, current source 302 is configured to supply 20 milliamps (mA) and control interface power supply 110 is 1 v. Therefore, this embodiment would satisfy a power budget of at least 2.56 W.

Figure 4:
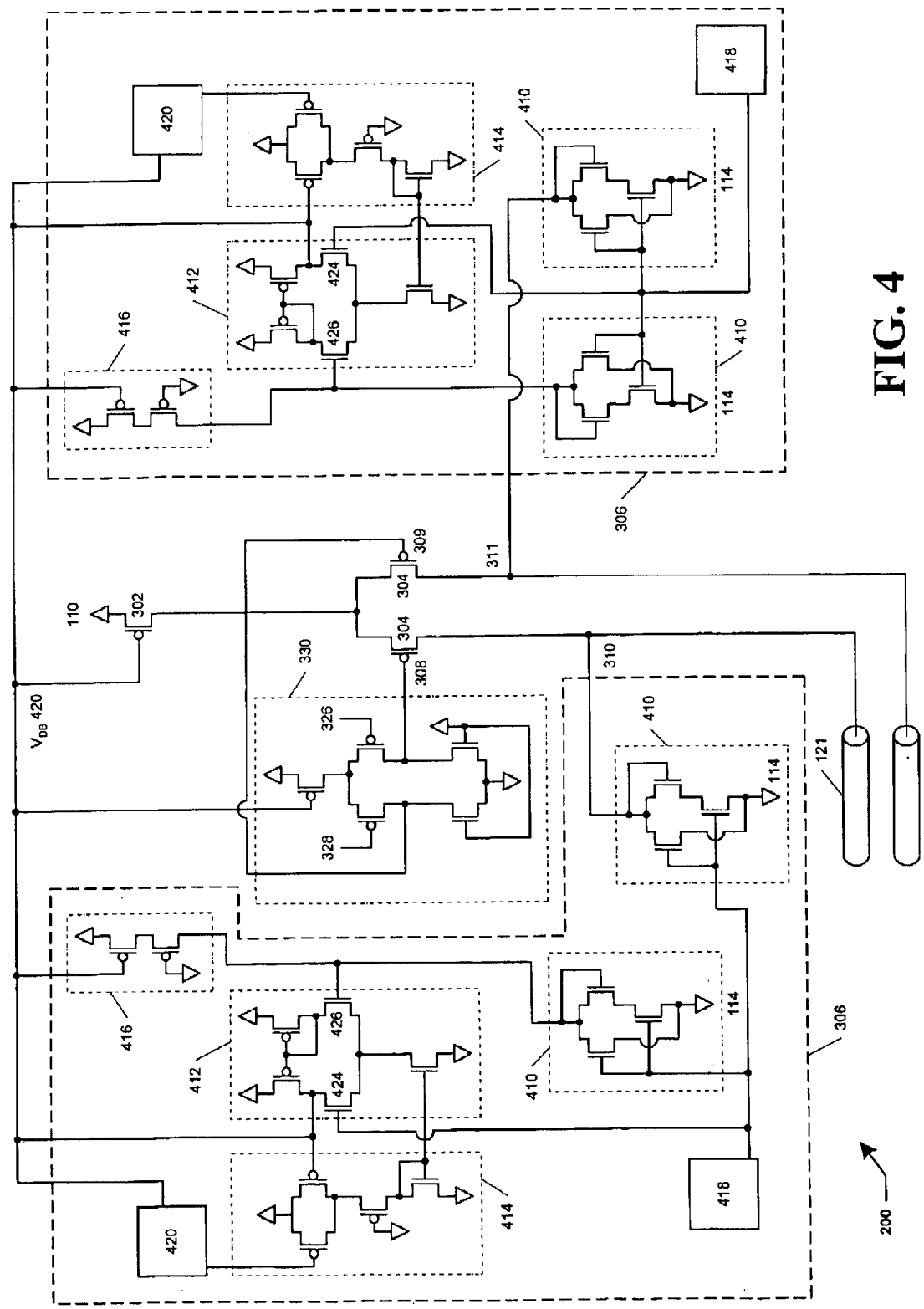
FIG. 4 is a schematic view of another embodiment of the control driver of FIG. 2.

FIG. 4 depicts one embodiment of control driver 200 in accordance with the systems and methods described herein. In this embodiment current source 302, and switching units 304 are P-type transistors and pre-driver circuit 330 is a sense amplifier. Pre-driver circuit 330 takes internal control input signals 326 and 328 and converts them to differential control output signals 320 and 321 with controlled data edge rates. Each resistive bias unit 306 is preferably coupled to a switching unit 304, current source 302 and bus 121. Each resistive bias unit 306 provides resistive loads 410 to a switching unit 304. Resistive loads 410 are sized to provide the correct VOH levels to differential control output signals 322 and 323. In addition to providing resistive loads 410, resistive bias units 366 also provide the capability of tracking the control output current supplied to control driver 200 through current source 302.

Process variations in the fabrication process can skew the size of the circuitry within memory interface system 100. These process variations in turn result in performance variations, particularly in the output current drawn by control driver 200 and memory driver 204. For instance, if the resistance provided by a resistive load 410 varies, then the output current drawn by control driver 200 will vary as well. The output current may be either too high or too low, and this causes constraints on memory interface system 100. Control interface 104 and memory interfaces 108 must then be designed to accept the variations in output current levels resulting from the process variations. This has a negative impact on the operating performance of memory interface system 100. Also, since designs transfer to new semiconductor processes frequently, control interface 104 and memory interface 108 must be redesigned and rescaled to make fabrication in a new process successful.

By tracking the control output current of current source 302, resistive bias units 306 adjust the performance of control driver 200 to maintain constant voltage output levels despite process variations. Each resistive bias unit 306 includes resistive loads 410, sense amplifier 412, first bias circuit 414, second bias circuit 416, third bias circuit 418 and initialization circuit 420. First bias circuit 414, second bias circuit 416 and initialization circuit 420 provide a constant driver bias voltage (VDB) 430 to resistive bias unit 306.

If control driver 200 outputs too little output current from current source 302 due to any fluctuation in $V_{DB}$ 430, say an increase in $V_{DB}$ 430, the incremental increase in $V_{DB}$ 430 will cause a decrease at the gate input of transistor 426 from its nominal voltage value. Sense amplifier 412 will then pull $V_{DB}$ 430 back to it's nominal value. Therefore, this decrease in $V_{DB}$ 430 returns the control output current to the proper level through current source 302.

The converse is true as well, any increase in control output current caused by a decrease in $V_{DB}$ 430, in turn creates an increase at the gate input of transistor 426. In this manner, resistive bias unit 306 tracks the control output current of control driver 200 and allows control driver 200 to drive the correct voltage output levels independent of any process skews.

The current tracking capability of resistive bias unit 306 provides a further advantage in sizing the p-type transistors comprising current source 302 and switching units 304. In typical semiconductor processing, p-type transistors are larger than their n-type counterparts in order to counteract doping inefficiencies. Because it is cost efficient to keep circuit sizes small, p-type transistors are disfavorable. However, the tracking capability provided by resistive bias units 306 allow the p-type transistors comprising current source 302 and switching units 304 to be smaller because the transistors do not have to be sized to take into account the process skews that would negatively effect the driver operating performance.

Initialization circuit 420 also provides the proper initialization bias to control driver 200 when control unit 102 is first powered up. Third bias circuit 418 provides a constant bias to resistive loads 410, which is composed of several n-type transistors in this embodiment. The constant bias provided to resistive loads 410 operates to keep resistive loads 410 in a constant operating state, which, in turn creates a constant resistance. The size of the n-type transistors and the bias provided are pre-determined to create a resistance equal or near that of the $Z_{out}$ of bus 121, which in this embodiment is 65 Ω.

Figure 5:
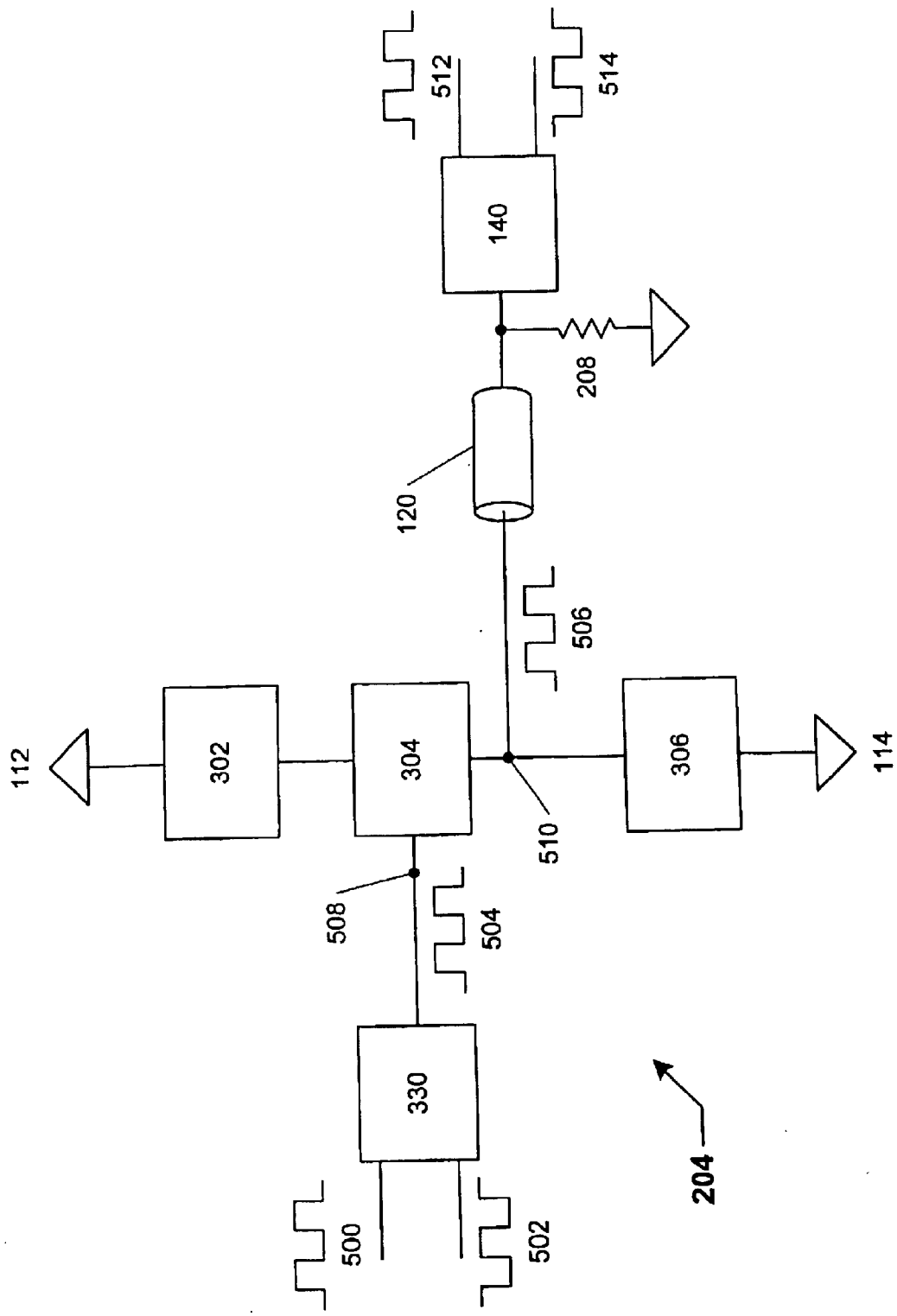
FIG. 5 is a schematic view of one embodiment of the memory driver of FIG. 2

FIG. 5 depicts memory driver 204 in accordance with the systems and methods described herein. Memory driver 204 operates in a manner similar to that of control driver 200 and preferably includes current source 302, switching unit 304 and resistive bias unit 306. Current source 302 is coupled to memory interface power supply 112 and resistive bias unit 306 is coupled to common supply 114. Memory output signal 506 is output at output 510, which is coupled to bus 120.

Pre-driver circuit 330 takes internal memory input signals 500 and 502 and converts them to single-ended memory output signal 508. Internal memory input signals 500 and 502 are internal logic signals generated by memory unit 106. Pre-driver circuit 330 controls the data edge rate of memory input signal 504 and preferably provides faster voltage swings which translate into more abrupt logic transitions. Pre-driver circuit 330 then provides single-ended memory output signal 504 to switching unit 304 at input 508. Pre-driver circuit 330 is preferably included within memory driver 204, but can be disregarded if the application does not require additional data edge rate control.

When switching unit 304 is open, current source 302 cannot provide memory output current to output 510. Output 510 is driven to common supply 114 and a corresponding low signal is output to bus 120. When switching unit 304 is closed, current source 302 drives memory output current through resistive bias unit 306. Resistive bias unit 306 provides a resistive load that creates a voltage drop when memory output current is passed through it. The voltage at memory interface power supply 112 less the voltage drop over resistive bias unit 306 and the voltage supplied at common supply 114, is the VOH driven onto bus 120. Accordingly, resistive bias unit 306 is sized such that the desired VOH is met. Memory output signal 506 is transferred over bus 120 to buffer unit 140, which converts single-ended memory output signal 506 to differential memory output signals 512 and 514.

Figure 6:
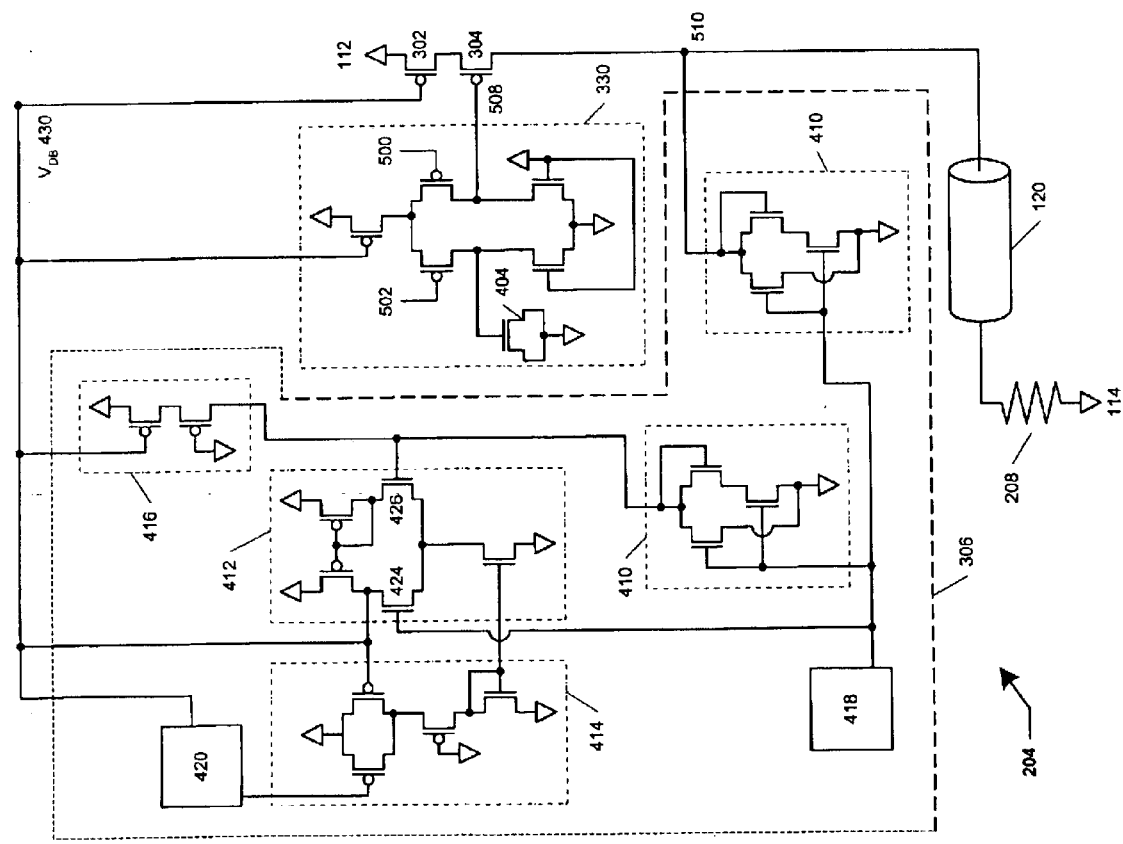
FIG. 6 is a schematic view of another embodiment of the memory driver of FIG. 2.

FIG. 6 depicts one embodiment of memory driver 204 in accordance with the systems and methods described herein. In this embodiment, current source 302 and switching unit 304 are P-type transistors and pre-driver circuit 330 is a sense amplifier. Pre-driver circuit 330 senses the difference between differential memory input signals 500 and 502 and converts them to the single ended input signal 504. Differential memory input signals 500 and 502 are internal logic signals generated by memory unit 106. To balance the load created by input 508, pre-driver circuit 330 includes capacitive load 404.

Switching unit 304 is configured to open and close according to memory input signal 504. When switching unit 304 is open, current source 302 cannot provide memory output current to output 510. Output 510 is driven to the voltage at common supply 114 and a corresponding logic low signal is output to bus 120. When switching unit 304 is closed, current source 302 drives memory output current through resistive bias unit 306. Resistive bias unit 306 includes resistive loads 410, which create a voltage drop when memory output current is passed through them. Memory output signal 506 is transferred over bus 120 to buffer unit 140 where it is converted to differential memory output signals 512 and 514.

In a preferred embodiment, common supply 114 is set to ground. This configuration provides the advantage of driving memory output current only when output 510 is a logic high. When switching unit 304 is open, output 510 is driven to the voltage at common supply 114, but since no memory output current is passing through switching unit 304, memory driver 204 dissipates little power. Memory driver 204 dissipates a significant amount of power when switching unit 304 is closed and memory output current is passing through it. The typical configuration where current is driven at both voltage output levels will result in twice the power dissipation.

In this embodiment, the common supply is set to ground, so $V_{OL}$ is equal to 0 v.

Therefore, $V_{OH}$ is equal to the output voltage swing ($V_{out}$) for memory interface system 100. $V_{out}$ is equal to the output current ($I_{out}$) times the effective resistance in the channel ($R_{out}$), which is equal to the resistance ($R_B$) of resistive bias unit 306 in parallel with termination resistor 208 ($R_{term}$) or:

$$V_{out} = I_{out} \cdot R_{out} = I_{out} \cdot (R_B \| R_{term}).$$

Termination resistor 208 and resistive bias unit 306 have a set resistance so that the parallel combination of the two will create a resistance at or near the output impedance ($Z_{out}$) of bus 120, which is measured at the termination of bus 120 as shown in FIG. 2. This is in order to minimize signal reflections created by the termination of bus 120. Preferably, $R_{out}$ will be in the range of 40–50 ohms (i). This value is generally less that that of $Z_{out}$ of bus 121 because the signal traces comprising bus 121 are more narrow due to the greater size of 128b. In this embodiment, $Z_{out}$ of bus 120 and $R_{out}$ are both 50Ω.

The power budget available to memory interface 108 determines the $I_{out}$ provided by current source 302. The power budget is the amount of power available over time, and is determined by the application and typically depends on the available power supplies, heat dissipating equipment and maximum reliable operating temperatures. In this embodiment, memory interface 108 has 64 separate IO pins 212, each connected to 64b bus 120. The power budget should be greater than or equal to memory interface power supply 112 times $I_{out}$ times the number of IO pins, or:

Power Budget ≥ $I_{out}$·Power supply 112·number IO pins

In this embodiment, current source 302 is configured to supply 20 milliamps (mA) and memory interface power supply 112 is 1 v. Therefore, this embodiment would satisfy a power budget of at least 1.28 W.

Resistive bias unit 306 is preferably coupled to switching unit 304 and current source 302. Resistive bias unit 306 provides resistive loads 410 to switching unit 304. Resistive loads 410 is sized to match termination resistor 208 in order to minimize signal reflections, and in this embodiment resistive loads 410 has a resistance of 50 Ω. In addition to providing resistive loads 410, resistive bias unit 306 also provides the capability of tracking the memory output current supplied through current source 302.

By tracking the memory output current of current source 302, resistive bias unit 306 adjusts the performance of memory driver 204 to maintain constant output current levels despite process variations. Resistive bias unit 306 includes resistive loads 410, sense amplifier 412, first bias circuit 414, second bias circuit 416, third bias circuit 418 and initialization circuit 420. First bias circuit 414, second bias circuit 416 and initialization circuit 420 provide a constant driver bias voltage ($V_{DB}$) 430 to resistive bias unit 306. Third bias circuit 418 provides a bias voltage to sense amplifier 412 and resistive loads 410.

If control driver 200 outputs too little output current from current source 302 due to any fluctuation in $V_{DB}$ 430, say an increase in $V_{DB}$ 430, the incremental increase in $V_{DB}$ 430 will cause a decrease at the gate input of transistor 426 from its nominal voltage value. Sense amplifier 412 will then pull $V_{DB}$ 430 back to it's nominal value. Therefore this decrease in $V_{DB}$ 430 returns the control output current to the proper level through current source 302.

The converse is true as well, any increase in control output current caused by a decrease in $V_{DB}$ 430, in turn creates an increase at the gate input of transistor 426. In this manner, resistive bias unit 306 tracks the control output current of control driver 200 and allows control driver 200 to drive the correct voltage output levels independent of any process skews.

Figure 7:
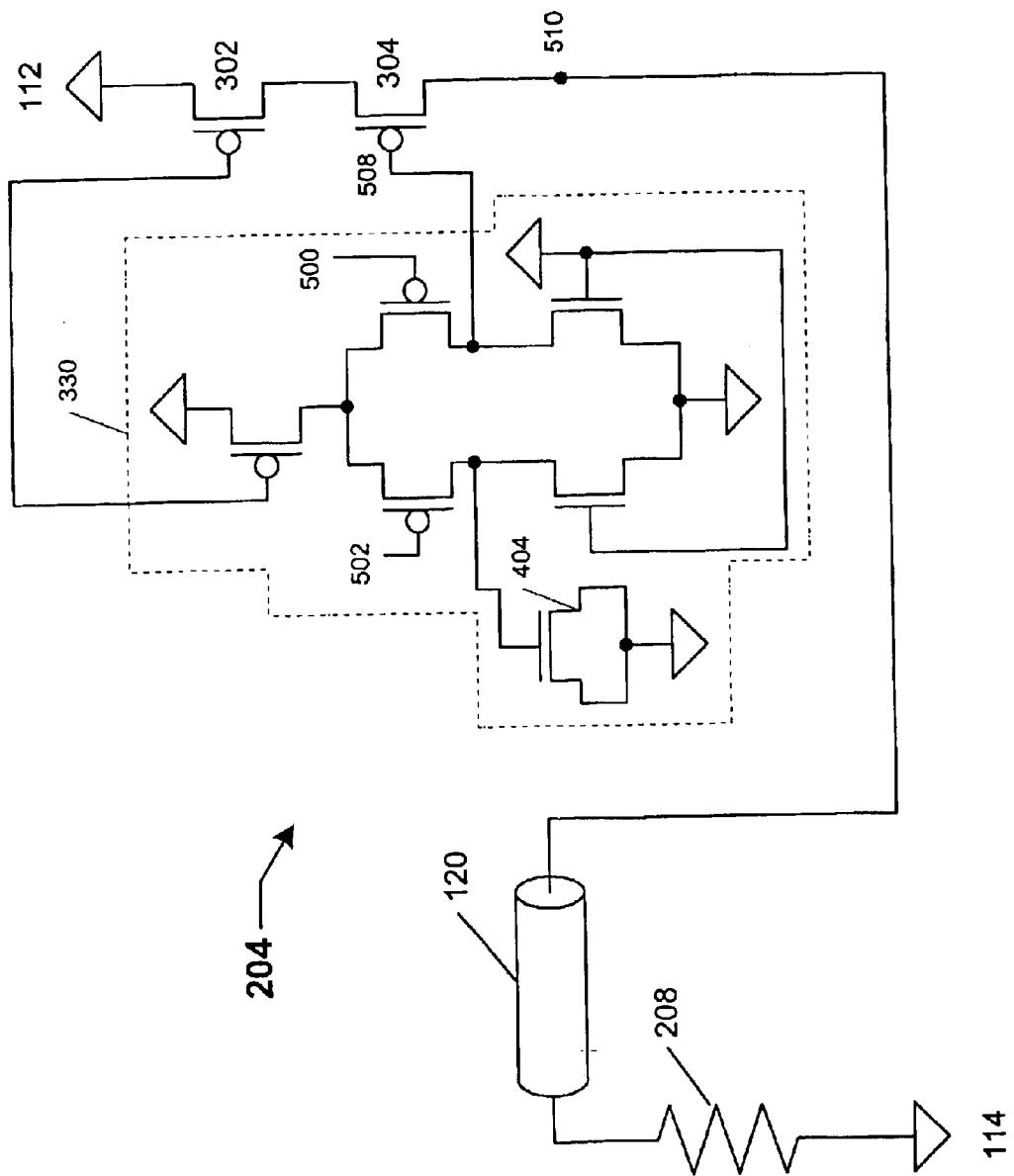
FIG. 7 is a schematic view of another embodiment of the memory driver of FIG. 2.

FIG. 7 depicts another embodiment of memory driver 204 in accordance with the systems and methods described herein. This embodiment does not require resistive bias unit 306 to provide a resistive load or memory output current tracking capability. Instead, switching unit 304 couples directly to bus 120 and not common supply 114. As a result, memory driver 204 relies on the resistive load created by termination resistor 208 and buffer unit 140. By eliminating resistive bias unit 306, memory interface 108 dissipates less power because the voltage drop used to create $V_{OH}$ occurs outside memory interface 108 itself. Also, the size of memory interface 108 is reduced because the additional circuitry needed to comprise resistive bias unit 306 is eliminated.

Figure 8:
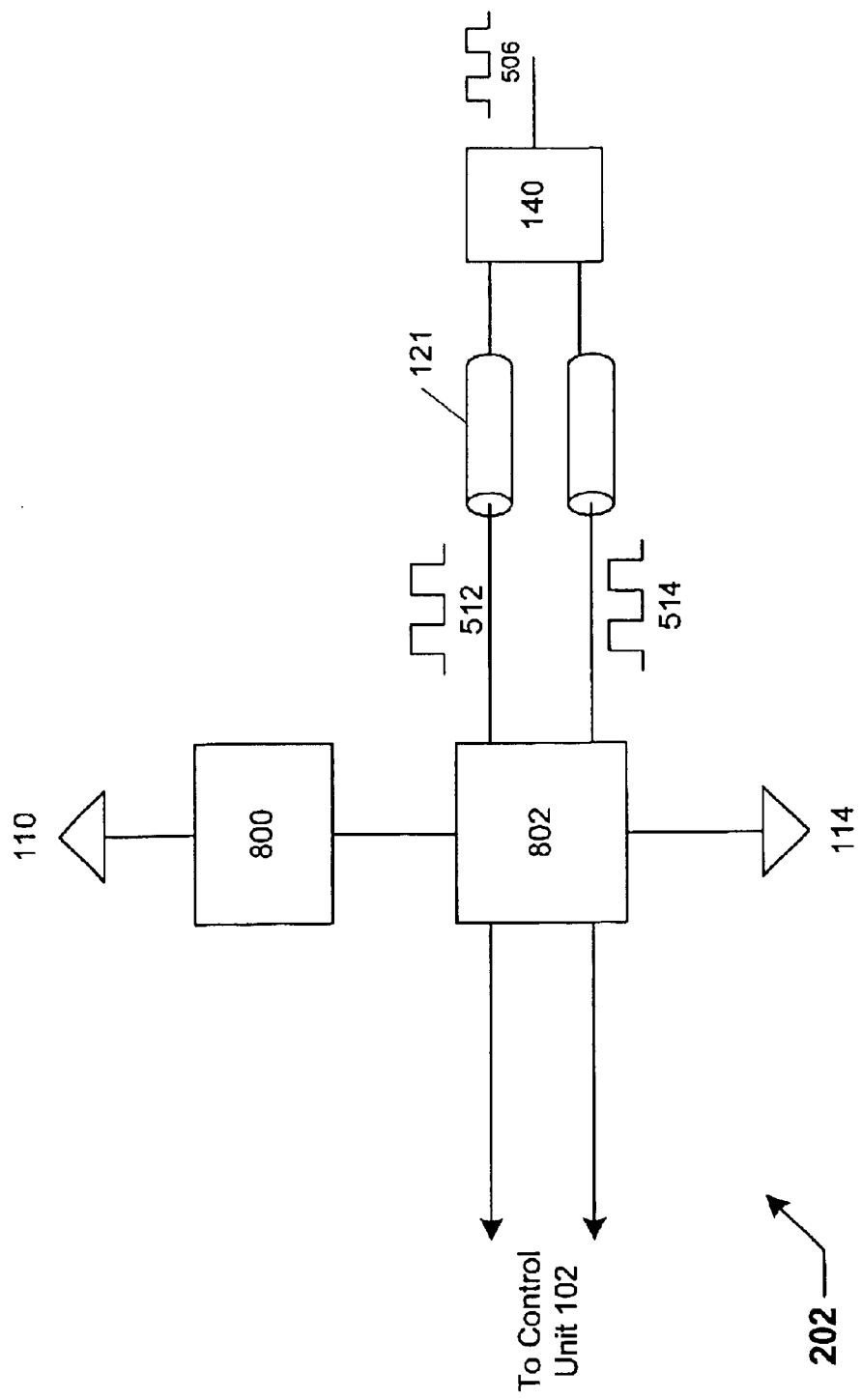
FIG. 8 is a schematic view of one embodiment of the control receiver of FIG. 2.

FIG. 8 depicts control receiver 202 in accordance with the systems and methods described herein. Control receiver 202 includes current source 800 coupled to control interface power supply 110 and to sense amplifier 802. Current source 800 provides the current to sense amplifier 802 which is coupled to common supply 114 and to bus 121. Sense amplifier 802 receives differential memory output signals 512 and 514 from buffer unit 140 and converts theme to internal signals used by control unit 102. Control receiver 202 scales the received signal to an internal level that is used by control unit 102. Once the received signal is at the proper level, control unit 102 can perform data manipulation.

Figure 9:
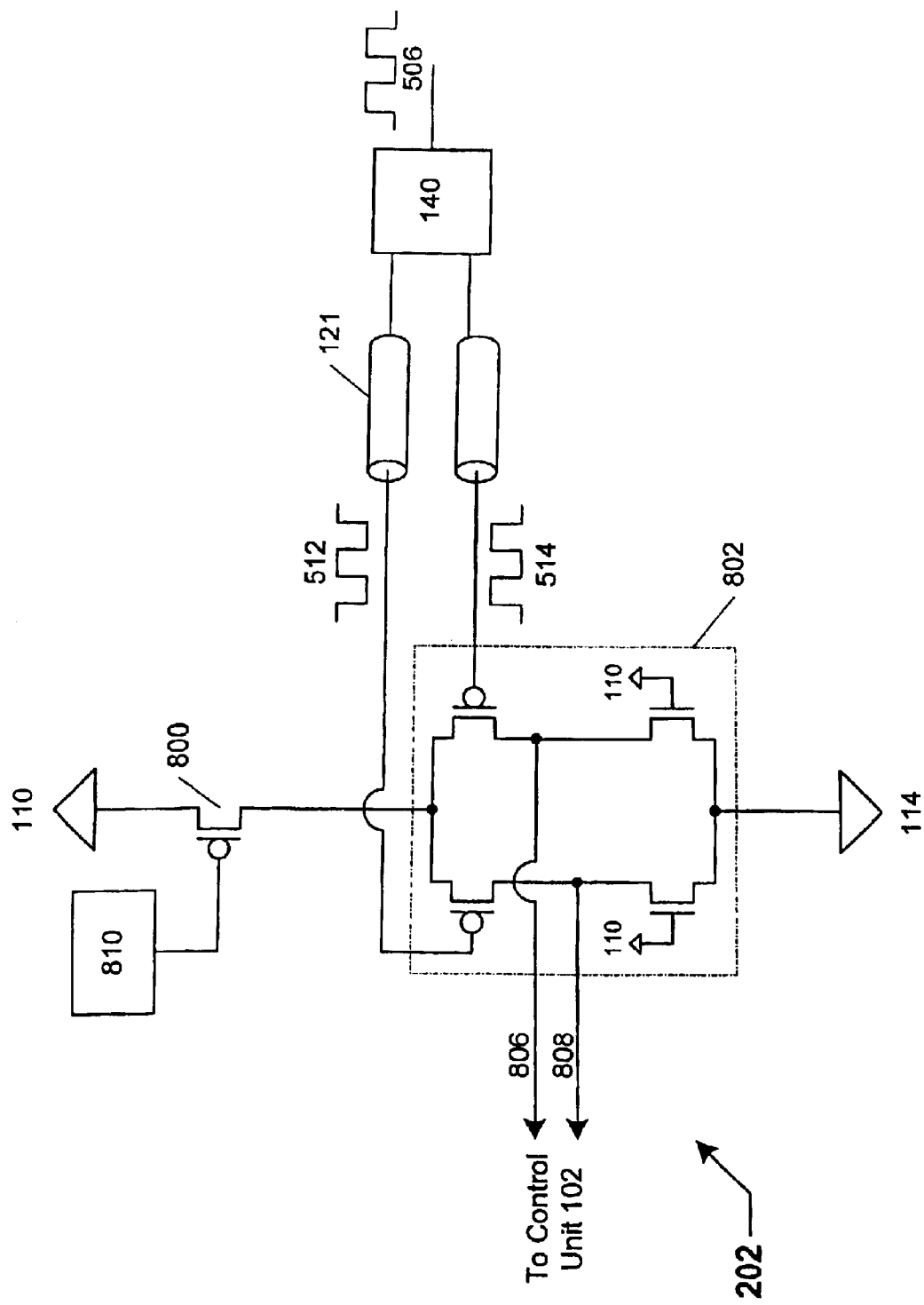
FIG. 9 is a schematic view of another embodiment of the control receiver of FIG. 2.

FIG. 9 depicts an embodiment of control receiver 202 in accordance with the systems and methods described herein. In this embodiment, current source 800 is a P-type transistor, which is biased by bias circuit 810. Sense amplifier 802 includes two N-type and P-type transistor pairs, where the junctions of the P-type and N-type transistors provide the differential output signals 806 and 808.

Figure 10:
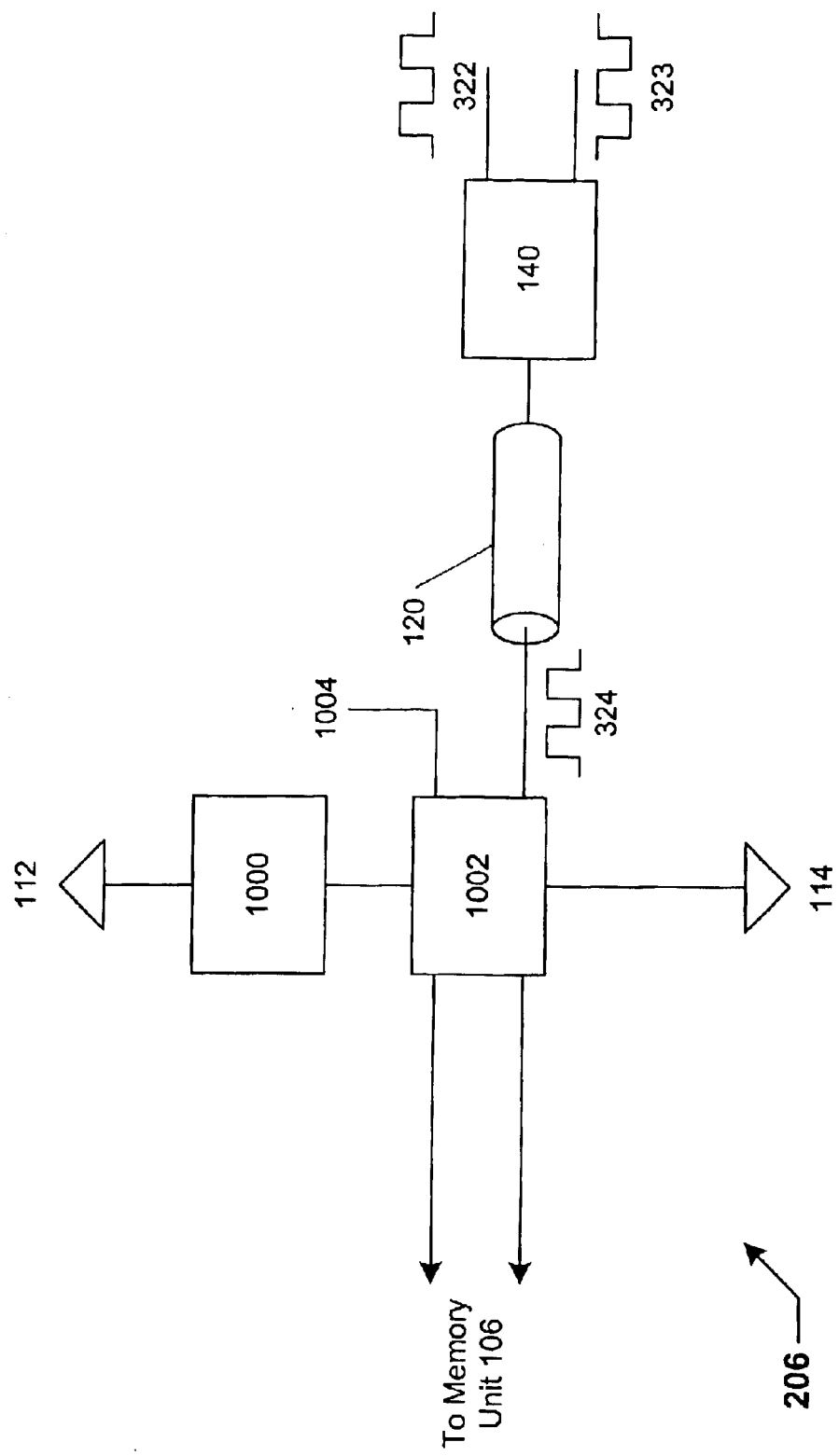
FIG. 10 is a schematic view of one embodiment of the memory receiver of FIG. 2.

FIG. 10 depicts memory receiver 206 in accordance with the systems and methods described herein. Memory receiver 206 includes current source 1000 coupled to memory interface power supply 112 and to sense amplifier 1002. Current source 1000 provides the current to sense amplifier 1002 which is coupled to common supply 114 and to bus 120. Sense amplifier 1002 receives single-ended control output signal 324 from buffer unit 140. Sense amplifier 1002 then uses reference voltage 1004 to convert control output signal 324 to differential signals which are then used by memory unit 106. Memory receiver 206 also scales the received signal to an internal level that is used by memory unit 106. Once the received signal is at the proper level, memory unit 106 can perform data manipulation.

Figure 11:
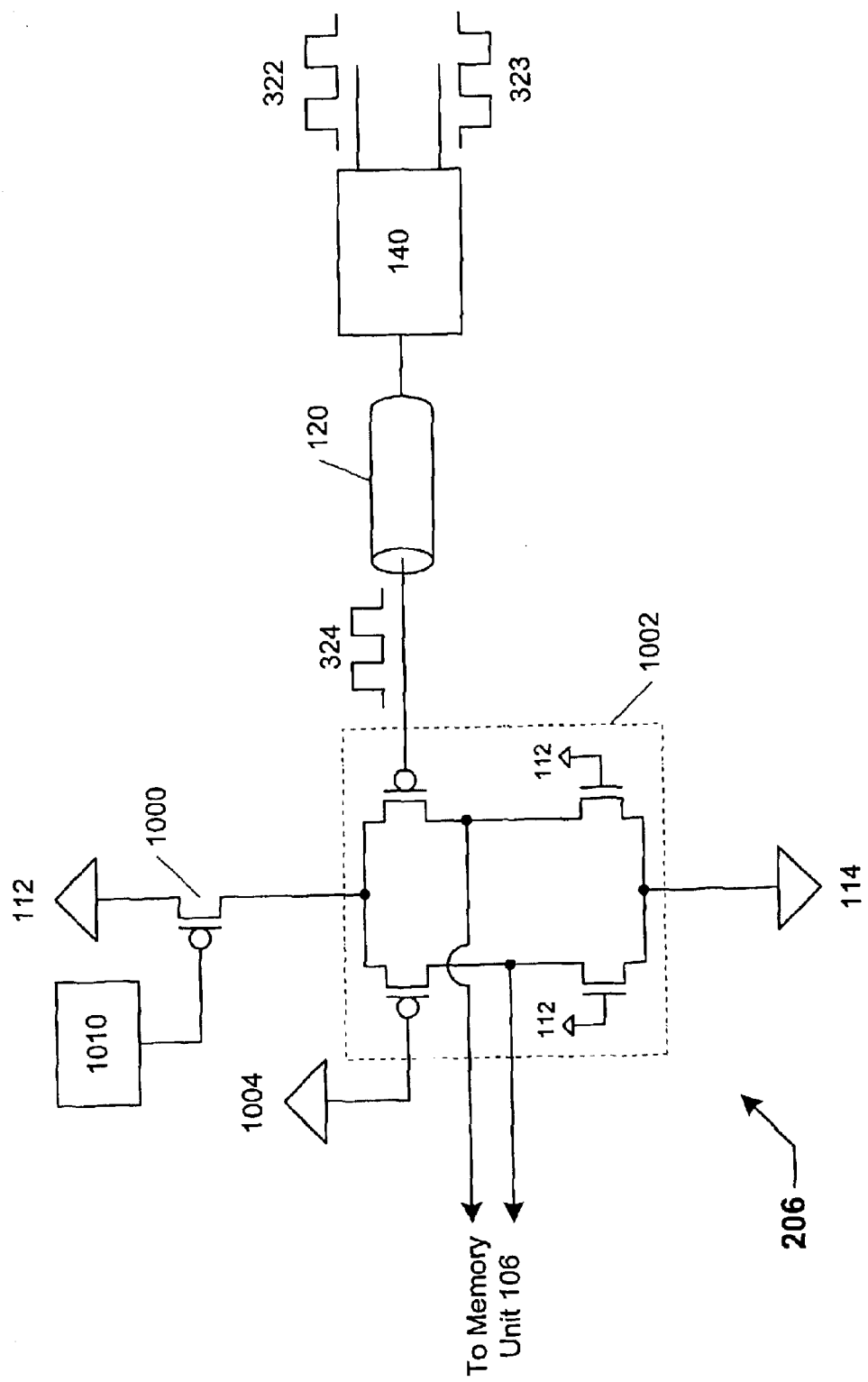
FIG. 11 is a schematic view of another embodiment of the memory receiver of FIG. 2.

FIG. 11 depicts an embodiment of memory receiver 202 in accordance with the systems and methods described herein. In this embodiment, current source 1000 is a P-type transistor, which is biased by bias circuit 1010. Sense amplifier 1002 includes two N-type and P-type transistor pairs, where the junctions of the P-type and N-type transistors provide the differential signals used by memory unit 106. Reference voltage 1004 is compared to the voltage level of the incoming control output signal 324 and the difference in voltage is used to generate the differential signals used by memory unit 106.

While various embodiments of the invention have been described, it will be apparent to those of ordinary skill in the art that many more embodiments and implementations are possible that are within the scope of this invention.

What is claimed is:

1. A memory interface system comprising: a differential control interface coupled with a first power supply, a common voltage supply and a buffer unit, wherein the differential control interface is configured to drive a first and a second differential control output signal, and wherein the voltage output swing of the first and second differential control output signals is between a voltage output high level and the common; and
    a plurality of single-ended memory interfaces coupled with a second power supply, the common voltage supply and the buffer unit, wherein each single-ended memory interface is configured to drive a single-ended memory output signal to the common voltage to transfer a logic low, wherein the buffer unit is coupled with the first power supply, and the buffer unit is configured to transfer data between the differential control interface and the single-ended memory interface.

2. The system of claim 1, wherein the first power supply operates at a lower voltage than the second power supply.

3. The system of claim 1, wherein the common supply is ground.

4. The system of claim 1, wherein the buffer unit is configured to: convert the first and second differential control output signals to a single-ended control output signal; and
    output the single-ended control output signal to the single-ended memory interface.

5. The system of claim 1, wherein the buffer unit is configured to:
    convert the single-ended memory output signal to a first and a second differential memory output signal; and
    output the first and second differential memory output signal to the differential control interface.

6. The system of claim 1, wherein each single-ended memory interface comprises a memory driver configured to drive the single-ended memory output signal and wherein the differential control interface comprises a control driver configured to drive the first and second differential control output signals.

7. The system of claim 6, wherein the control driver comprises a resistive bias circuit configured to track output current output current of the control driver.

8. The system of claim 5, wherein the differential control interface comprises a control receiver configured to receive the first and second differential memory output signals from the buffer unit, and wherein the plurality of single-ended memory interfaces each comprise a memory receiver configured to receive the single-ended control output signal from the buffer unit.

9. A memory interface system for transferring data, the system comprising a control driver configured to drive a first and a second control output signal, the control driver comprising:
    a first current source coupled with a first power supply, the first current source
    configured to provide a control output current;
    a first switching unit coupled with the first current source, the first switching unit configured to switch based on a first control input signal;
    a first resistive bias unit coupled with the first switching unit, the first resistive bias unit configured to track the control output current;
    a first bus coupled between the first switching unit and the first resistive bias unit, wherein the first control output signal is the voltage level between the first switching unit and first resistive bias unit;
    a second switching unit coupled with the first current source, the second switching unit configured to switch based on a second control input signal;
    a second resistive bias unit coupled with the second switching unit, the second resistive bias unit configured to track the control output current;
    a second bus coupled between the second switching unit and the second resistive bias unit, wherein the second control output signal is the voltage level between the second switching unit and second resistive bias unit.

10. The system of claim 9, further comprising a pre-driver circuit configured to convert a first differential data signal and a second differential data signal to the first control input signal and the second control input signal, respectively.

11. The system of claim 9, wherein the first resistive bias unit comprises a first sense amplifier and wherein the second resistive bias unit comprises a second sense amplifier, the first and second sense amplifiers configured to track the control output current.

12. The system of claim 9, wherein the first and second switching units each comprise a P-type transistor.

13. The system of claim 9, wherein the first current source comprises a P-type transistor.

14. A memory interface system for transferring data, the system comprising a control driver configured to drive a first and a second control output signal, the control driver comprising:
    a first current source coupled with a first power supply, the first current source configured to provide a control output current;
    a first switching unit coupled with the first current source, the first switching unit configured to switch based on a first control input signal;
    a first resistive bias unit coupled with the first switching unit, the first resistive bias unit configured to track the control output current;
    a first bus coupled between the first switching unit and the first resistive bias unit, wherein the first control output signal is the voltage level between the first switching unit and first resistive bias unit;

a second switching unit coupled with the first current source, the second switching unit configured to switch based on a second control input signal;

a second resistive bias unit coupled with the second switching unit, the second resistive bias unit configured to track the control output current;

a second bus coupled between the second switching unit and the second resistive bias unit, wherein the second control output signal is the voltage level between the second switching unit and second resistive bias unit, wherein the first and second buses are coupled to a buffer unit configured to convert the first and second differential control output signals to a single-ended control output signal and the buffer unit is further configured to output the single-ended control output signal to a memory interface over a third bus.

15. The system of claim 14, wherein the memory interface comprises a memory driver, the memory driver configured to drive a memory output signal, the memory driver comprising:

a second current source coupled with a second power supply;

a third switching unit coupled with the second current source, the third switching unit configured to switch based on a memory input signal; and the third bus coupled with the second switching unit, the buffer unit and a termination resistor, wherein the memory output signal is the voltage level output by the third switching unit.

16. The system of claim 15, wherein the third switching unit and the second current source each comprise a P-type transistor.

17. A memory interface system for transferring data, the system comprising a control driver configured to drive a first and a second control output signal, the control driver comprising:

a first current source coupled with a first power supply, the first current source configured to provide a control output current;

a first switching unit coupled with the first current source, the first switching unit configured to switch based on a first control input signal;

a first resistive bias unit coupled with the first switching unit, the first resistive bias unit configured to track the control output current;

a first bus coupled between the first switching unit and the first resistive bias unit, wherein the first control output signal is the voltage level between the first switching unit and first resistive bias unit;

a second switching unit coupled with the first current source, the second switching unit configured to switch based on a second control input signal;

a second resistive bias unit coupled with the second switching unit, the second resistive bias unit configured to track the control output current;

a second bus coupled between the second switching unit and the second resistive bias unit, wherein the second control output signal is the voltage level between the second switching unit and second resistive bias unit; and a first pre-driver circuit and a second pre-driver circuit, the first pre-driver circuit configured to control a data edge rate of the first control input signal and the second pre-driver circuit configured to control a data edge rate of the second control input signal.

18. A memory interface system, comprising:

a memory control hub configured to transfer data to a memory module by way of a buffer unit, the memory control hub comprising a control interface coupled to a first power supply and a common voltage supply, the control interface configured to drive a first and a second differential control output signal, wherein the voltage output swing of the first and second differential control output signals is between a differential voltage output level and the common voltage; and the memory module comprising a plurality of memory interfaces, each memory interface coupled to a second power supply, a common supply and the buffer unit, and each memory interface configured to drive a single-ended memory output signal to the buffer unit, wherein the single-ended memory output signal is driven to a voltage output high level to transfer a logic high, and the single-ended memory output signal is driven to the common supply voltage to transfer a logic low.

19. The system of claim 18, wherein:

the control interface comprises a control driver configured to drive the first and second differential control output signal, the control driver comprising a first resistive bias unit and second resistive bias unit configured to track the control output current, and a control receiver configured to receive the single-ended memory output signal; and the memory interface comprises a memory driver configured to drive the single-ended memory output signal, and a memory receiver configured to receive the single-ended control output signal.

20. The system of claim 18, wherein the common supply is set to ground.

21. The system of claim 18, wherein the buffer unit is configured to:

convert the first and second differential control output signals to a single-ended control output signal;

output the single-ended control output signal to a selected memory interface;

convert the single-ended memory output signal to a first and a second differential memory output signal; and output the first and second differential memory output signal to the control interface.

* * * * *